US007087992B2

(12) United States Patent
Chua et al.

(10) Patent No.: US 7,087,992 B2
(45) Date of Patent: *Aug. 8, 2006

(54) MULTICHIP WAFER LEVEL PACKAGES AND COMPUTING SYSTEMS INCORPORATING SAME

(75) Inventors: Swee Kwang Chua, Singapore (SG); Siu Waf Low, Singapore (SG); Yong Poo Chia, Singapore (SG); Meow Koon Eng, Singapore (SG); Yong Loo Neo, Singapore (SG); Suan Jeung Boon, Singapore (SG); Suangwu Huang, Singapore (SG); Wei Zhou, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/999,435

(22) Filed: Nov. 30, 2004

(65) Prior Publication Data

US 2005/0073029 A1    Apr. 7, 2005

Related U.S. Application Data

(60) Continuation of application No. 10/656,352, filed on Sep. 5, 2003, now Pat. No. 6,825,553, which is a division of application No. 10/229,914, filed on Aug. 27, 2002, now Pat. No. 6,964,881.

(51) Int. Cl.
*H01L 23/34* (2006.01)
*H01L 23/48* (2006.01)

(52) U.S. Cl. ............... 257/723; 257/691; 257/693; 257/698

(58) Field of Classification Search ............... 257/723, 257/691, 693, 698, 758, 774, 690
See application file for complete search history.

(56) References Cited

U.S. PATENT DOCUMENTS 3,903,590 A * 9/1975 Yokogawa .................. 438/107

(Continued)

FOREIGN PATENT DOCUMENTS

JP          63-69258 A          3/1988

(Continued)

*Primary Examiner*—Jasmine Clark
(74) *Attorney, Agent, or Firm*—TraskBritt, PC

(57) ABSTRACT

The present invention defines a packaging implementation providing a multichip multilayer system on a chip solution. Greater integration of a plurality and variety of known good die contained within cavities formed in a separate substrate is achieved. Additional redistribution and interconnect layers above the multichip configuration may be formed with the redistribution layers terminating in electrical connections such as conductive bumps or balls. In one embodiment, the substrate cavities receive signal device connections, such as conductive bumps, of a plurality of semiconductor dice in a flip-chip configuration. A portion of the substrate's back surface is then removed to a depth sufficient to expose the conductive bumps. In another embodiment, the cavities receive the semiconductor dice with their active surface facing up, wherein metal layer connections are formed and coupled to bond pads or other electrical connectors of the semiconductor dice. Computing systems incorporating the packaging are also disclosed.

25 Claims, 5 Drawing Sheets

U.S. PATENT DOCUMENTS

| | | | |
|---|---|---|---|
| 4,866,501 A | | 9/1989 | Shanefield |
| 5,073,814 A | * | 12/1991 | Cole et al. .................. 257/643 |
| 5,280,192 A | * | 1/1994 | Kryzaniwsky ............... 257/723 |
| 5,315,486 A | * | 5/1994 | Fillion et al. ............... 361/795 |
| 5,324,687 A | * | 6/1994 | Wojnarowski ............... 438/107 |
| 5,331,203 A | * | 7/1994 | Wojnarowski et al. ...... 257/698 |
| 5,432,677 A | * | 7/1995 | Mowatt et al. ............. 361/719 |
| 5,434,751 A | * | 7/1995 | Cole et al. .................. 361/792 |
| 5,527,741 A | * | 6/1996 | Cole et al. .................. 438/107 |
| 5,546,654 A | | 8/1996 | Wojnarowski et al. |
| 5,565,706 A | * | 10/1996 | Miura et al. ................ 257/723 |
| 5,745,984 A | * | 5/1998 | Cole et al. ................... 29/834 |
| 5,757,072 A | * | 5/1998 | Gorowitz et al. ........... 257/700 |
| 5,841,193 A | * | 11/1998 | Eichelberger ............... 257/723 |
| 5,844,304 A | * | 12/1998 | Kata et al. .................. 257/620 |
| 5,866,952 A | * | 2/1999 | Wojnarowski et al. ...... 257/788 |
| 5,936,305 A | | 8/1999 | Akram |
| 6,057,593 A | * | 5/2000 | Iovdalsky et al. .......... 257/659 |
| 6,175,161 B1 | | 1/2001 | Goetz et al. |
| 6,181,569 B1 | | 1/2001 | Chakravorty |
| 6,214,642 B1 | | 4/2001 | Chen et al. |
| 6,228,687 B1 | | 5/2001 | Akram et al. |
| 6,236,109 B1 | | 5/2001 | Hsuan et al. |
| 6,239,367 B1 | | 5/2001 | Hsuan et al. |
| 6,274,391 B1 | | 8/2001 | Wachtler et al. |
| 6,350,668 B1 | | 2/2002 | Chakravorty |
| 6,365,438 B1 | | 4/2002 | Ishida et al. |
| 6,368,896 B1 | | 4/2002 | Farnworth et al. |
| 6,389,691 B1 | | 5/2002 | Rinne et al. |
| 6,423,570 B1 | | 7/2002 | Ma et al. |
| 6,506,664 B1 | | 1/2003 | Beyne et al. |
| 6,518,163 B1 | | 2/2003 | Sakuyama et al. |
| 6,521,530 B1 | | 2/2003 | Peters et al. |
| 6,555,906 B1 | | 4/2003 | Towle et al. |
| 6,617,687 B1 | | 9/2003 | Akram et al. |
| 6,709,897 B1 | | 3/2004 | Cheng et al. |
| 6,709,898 B1 | | 3/2004 | Ma et al. |
| 6,734,534 B1 | | 5/2004 | Vu et al. |
| 6,756,662 B1 | | 6/2004 | Infantolino et al. |
| 6,774,473 B1 | | 8/2004 | Shen |
| 6,825,553 B1 | * | 11/2004 | Chua et al. ................. 257/691 |
| 6,867,499 B1 | | 3/2005 | Tabrizi |
| 2002/0050585 A1 | | 5/2002 | Masayuki et al. |
| 2002/0070443 A1 | | 6/2002 | Mu et al. |
| 2003/0036257 A1 | | 2/2003 | Masumoto et al. |
| 2003/0124835 A1 | | 7/2003 | Lin et al. |
| 2003/0227095 A1 | | 12/2003 | Fujisawa et al. |

FOREIGN PATENT DOCUMENTS

| | | |
|---|---|---|
| JP | 408060103 A | 6/1996 |

* cited by examiner

MULTICHIP WAFER LEVEL PACKAGES AND COMPUTING SYSTEMS INCORPORATING SAME

CROSS-REFERENCE TO RELATED APPLICATIONS

This application is a continuation of application Ser. No. 10/656,352, filed Sep. 5, 2003, now U.S. Pat. No. 6,825,553, issued Nov. 30, 2004, which is a divisional of application Ser. No. 10/229,914, filed Aug. 27, 2002, now U.S. Pat. No. 6,964,881, issued Nov. 15, 2005.

BACKGROUND OF THE INVENTION

1. Field of the Invention

The present invention relates generally to semiconductor packaging. More particularly, the present invention relates to wafer level multichip packaging such as, for example, a system in a package solution.

2. State of the Art

Semiconductor chips (also referred to as die/dice herein) are found in many electronic products today. As semiconductor dice get smaller and more complex, the problem of making electrical connections between semiconductor dice, connections to carrier substrates such as printed circuit boards, and connections to intermediate substrates such as multichip modules which are, in turn, connected to carrier substrates has been addressed with a variety of constantly evolving solutions.

One of the earlier solutions included wire bonding from signal connection devices, such as bond pads of a semiconductor die, to pins or leads of a lead frame contained in a ceramic or plastic package. Finished packages are mounted to a carrier substrate, such as a printed circuit board, where the pins or leads make electrical connection with contact pads on the carrier substrate.

The term "signal connection devices" as used herein regarding semiconductor devices includes not only contact pads of a substrate and bond pads of a semiconductor device but also I/O connections for a semiconductor device created by adding circuitry from bond pads located on the active surface of the semiconductor device to different locations on the active surface of the semiconductor device. Such additional circuitry is typically effected using a so-called "redistribution layer" extending over the active surface or a surface of a semiconductor die.

An evolution of electrical connection technology occurred when multiple semiconductor dice were mounted on an intermediate substrate. In this instance, the semiconductor dice are typically connected to a lead frame by way of bonding wires. Signals, or electrical connections, required for coupling with an external device, such as a circuit board, are brought out to contact pads, pins or leads of the multichip module package. Other signals or electrical interconnections may be established between multiple semiconductor dice by way of circuitry formed on the intermediate substrate.

In these solutions, using wires for connecting a semiconductor die to a substrate and wire bonding processes can create problems. Such problems may include, for example, size and pitch (spacing) requirements for the bond pads of the semiconductor die and contact pads of the substrate; inductance in the signals due to the long curved wires; wire bond breakage and wire sweep causing shorting between adjacent wires; and high signal frequency semiconductor dice making the wire bonding process difficult and expensive.

Flip-chip technologies using solder balls or bumps have helped to alleviate some of these problems. For example, instead of wire bonding, conductive bumps such as, for example, balls of solder may be formed at the locations of the bond pads of a semiconductor die. A specialized lead frame, a dielectric tape carrying circuit traces as used in tape automated bonding processes, or other carrier substrates, such as a printed circuit board, may have electrical connection locations such as terminals, which correspond to the placement of the solder balls on the bond pads of the semiconductor die. The semiconductor die is "flipped" upside down so the solder balls are placed, for example, on the contact pads of a carrier substrate. A solder reflow process heats the solder balls until the solder begins to flow and bond with a corresponding contact pad of a carrier substrate. Upon cooling, the solder forms both mechanical and electrical connections between the carrier substrate and the semiconductor die. This packaging solution may alleviate at least some of the inductance problems, allowing for higher frequency performance and better signal integrity of the semiconductor die. Also, to a certain extent, it allows the contact pads of a substrate where conductive bumps were formed to be larger, more widely pitched and placed anywhere on the semiconductor die active surface rather than just around the periphery or down the center thereof.

Chip scale packaging has evolved from various standard flip-chip processes to a configuration wherein the size of a package is reduced to only slightly larger than the size of the semiconductor die. Chip scale packages are typically created using an interposer substrate. The semiconductor die, with solder balls or bumps such as described above, is attached and electrically connected to the interposer substrate and an encapsulation material is applied over the chip for protection thereof from the elements. The interposer substrate can redistribute signal connections to new locations so they are physically positioned in a desired pattern or arrangement, or to just a different pitch more suitable for mounting to an interposer substrate. An additional set of conductive bumps may then be formed at other contact pad locations on the interposer substrate. The resulting package may then be attached to a carrier substrate such as a printed circuit board.

Chip scale packaging enables small packages using desired ball grid arrays or fine ball grid arrays. However, the interposer substrate is typically made of an organic material which is the same as, or similar to, that used for printed circuit boards. There is conventionally a significant mismatch in the coefficients of thermal expansion (CTE) of the interposer substrate and the semiconductor die, often resulting in substantial stress on the mechanical and electrical interconnections formed between the semiconductor die and interposer substrate (e.g., a reflowed solder connection) during the normal thermal cycling during normal operation of the semiconductor die. The use of a ceramic substrate may alleviate some of the CTE mismatch concerns but at a considerably higher cost relative to more conventional interposer substrates.

Another advance in the area of multichip modules includes wafer scale integration. Wafer scale integration generally comprises fabricating multiple types of functional semiconductor dice on a single wafer. For example, a four-chip system may be created by placing a microprocessor next to a memory controller and two memory-type semiconductor dice. This pattern may then be repeated across the entire wafer. After fabrication, the wafer is sawed into individual segments with each segment containing the four different functions. However, this approach has not been a very satisfactory solution due to yield problems created by the variations in processes for forming processors and various types of memory-type semiconductor dice. For example, if a defect causes any one of the four functions to be inoperable, the entire segment is defective and not usable.

In addition to that described above, there have been advances in bump technologies where the conductive bumps act as the signal connection device. Conventional solder bumps, in some cases, have been replaced by stud bumps. Stud bumps have conventionally been gold, but copper and plated-type stud bumps have also been used recently. The stud bumps may actually comprise short wires or wire stubs applied to a semiconductor die using a conventional wire bonding process. Stud bumping has the advantages of using a more cost effective wire bonding process for application of the bumps in comparison to the more complex, multistep solder bumping process. Further, conductive and conductor-filled adhesives have also been employed to attach the conductive bumps to a carrier substrate. The conductive or conductor-filled adhesive may provide an amount of flexibility to the mechanical and electrical connection, thereby compensating for some of the problems associated with the mismatch of CTE often associated with solder bump processes as discussed above.

However, in light of the advances made in fabricating semiconductor device packages, there is a continued need for a reliable, cost effective solution with a higher integration of various functional semiconductor dice in a single package to produce, for example, a system on a semiconductor die solution. There is also a need to create smaller packages with more consistent thermal expansion properties while enabling the redistribution of signal connection devices of the various semiconductor dice to a more convenient, possibly denser, and optionally standard configuration for attachment to a carrier substrate.

Finally, it would be advantageous to provide a system on a chip packaging solution using known good dice, such use thereby increasing the yield of usable packages and, thus, improving the efficiency and cost effectiveness associated with producing such packages.

BRIEF SUMMARY OF THE INVENTION

The present invention includes new packaging implementation methods to solve or at least reduce some of the problems encountered in the prior art. Generally, the present invention provides a multichip multilayer system on a chip-type solution. Greater integration is accomplished using a plurality and variety of known good dice contained within cavities formed in a separate silicon substrate. The term "variety" includes semiconductor dice of not only different types (microprocessor, logic, memory, etc.) but functionally similar semiconductor dice of different dimensions and I/O arrangements. The present invention also contemplates the use of so-called "known good die," or KGD, as the semiconductor dice to be packaged.

The present invention enables the use of processes for making silicon-type semiconductor dice for creating additional redistribution and interconnect layers in the same plane or same planes vertically offset from the multichip arrangement. These additional layers may then be terminated with conductive bumps, optionally in a standard configuration, at the top layer for typical flip-chip application of the assembly to a carrier substrate such as printed circuit board or other multichip module substrate.

According to one embodiment of the present invention, a plurality of cavities is etched into the top of a substrate, such as a silicon wafer. The cavities are sized, configured and located to physically receive signal connection devices of a plurality and variety of types of semiconductor dice. The signal connection devices on the semiconductor die may be formed, for example, as gold stud bumps. A semiconductor die attach material adhesive with a high dielectric constant is applied to the top surface of the substrate and in the cavities. The substrate, a wafer, having the semiconductor dice thereon is flipped upside down and placed such that the signal connection devices are received by the cavities with the bond pads on the active surface of each semiconductor die making contact with the die attach material. A layer of molding compound is formed over the top of the substrate and over the backs of the various semiconductor dice. This molding compound creates the package structure, adds mechanical stability, and protects the semiconductor dice from the elements. A portion of the back surface of the substrate is removed, such as by back-grinding or another suitable process, until the signal connection devices are exposed through the back surface of the substrate. With the signal connection devices exposed, a dielectric layer is formed over the entire back surface of the wafer. The dielectric layer is then etched to expose the signal connection devices for use in connection to higher-level packaging.

According to another embodiment of the invention, a plurality of cavities is formed in the top surface of a substrate. The cavities are formed to receive the substantial entirety of each of the various semiconductor dice of a plurality to be packaged. Therefore, the cavities are individually sized and configured to correspond with the bond pads of each individual semiconductor die type that is used. It may be desirable to configure the cavities such that the active surface of a semiconductor die placed therein is approximately flush with the surface of the substrate. A die attach material is placed in the die cavities and the semiconductor dice are placed in the cavities with the active surface of each semiconductor die facing upwards and such that the back surfaces of the semiconductor dice contact the die attach material in the bottoms of the cavities. A dielectric layer is formed over the tops of the semiconductor dice, over the top of the substrate and into any gaps between the dice and the cavity sidewalls. Finally, vias are formed in the dielectric layer to expose signal connection devices on the various semiconductor dice.

The semiconductor device packages according to the present invention may further undergo a redistribution layer (RDL) process to form signal interconnections between semiconductor dice of the package or to redistribute signals from the signal connection device locations of the various types of semiconductor dice to more convenient and optionally standard locations for interconnection with an external device or component. In the redistribution layer process, a metal layer is deposited and patterned to create an interconnect layer from the exposed signal connection device (e.g., contact pad or conductive bump) locations to other locations.

Additional signal layers may be formed if so desired. This signal layering process includes three primary acts: first, a new dielectric layer is formed on the wafer; next, vias are formed in the dielectric layer so connections to an underlying metal layer may be formed; and finally, a new layer of metal is deposited and patterned to create an interconnect on this new layer as well as connections to the underlying layer through the vias.

Once the signal layering process is completed for the number of additional interconnect layers desired, a final interconnect layer is formed. At this juncture, a new dielectric layer is formed on the wafer. Next, openings are formed in the dielectric layer sufficient for the formation of new signal connection devices and for connections to the underlying metal layer. Finally, the new signal connection devices, such as conductive bumps in the form of solder balls, are formed in the openings.

At this point, if desired, testing may be accomplished through the solder balls on each of the individual silicon wafer segments containing a complete system on a wafer segment including various types of semiconductor dice. Finally, the process is completed by sawing the wafer into multichip segments, creating a plurality of individual multichip multilayer systems on chip packages, each ready for test and assembly.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

Figure 1A:
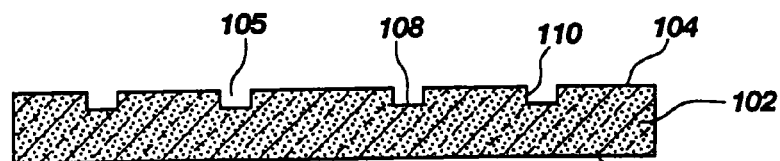
FIGS. 1A through 1F show cross-sectional views of a system package at various stages of fabrication according to an embodiment of the present invention.

Referring to drawing FIGS. 1A through 1F, the process of manufacturing a packaged semiconductor device according to an embodiment of the present invention is shown. Illustrated in drawing FIG. 1A is a cross-sectional view of a bare substrate 102. The substrate 102 material may include a conventional silicon wafer or other bulk silicon substrate such as is well known in the art. However, it is understood that this substrate 102 may comprise other well-known substrates such as a ceramic or other suitable material. A plurality of cavities 105 is formed in a top surface 104 (also referred to as an attachment surface) of the substrate 102, such as through a conventional anisotropic silicon etching process. The cavities 105 are each defined by a cavity base 108 and cavity walls 110. As indicated in drawing FIG. 1A, the cavity walls 110 may be formed to exhibit a generally rectangular geometry in cross section such that the cavities 105 are generally cubic in shape. However, the cavities 105 may exhibit other geometries such as, for example, cylindrical, conical, frustoconical, pyramidal, frustopyramidal or semispherical.

Figure 1B:

Referring next to drawing FIG. 1B, the top surface 104 of the substrate 102 is coated with a layer of die attach material 112 such as a die attach material that may be applied in a generally liquid form and then soft-baked or cured to a B-stage. The die attach material 112 may include epoxy resins and polyimides, as well as organic and polymer-based resins. Exemplary die attach materials include resins derived from B-stage benzocyclobutene (BCB) and which are available from Dow Chemical Company of Midland, Mich. The die attach material 112 may be applied to the substrate 102 using a conventional spin or spray coating process wherein the top surface 104 of the substrate 102 is coated and the cavities 105 are filled with the die attach material 112, as will be appreciated by those of ordinary skill in the art. The die attach material 112 may desirably exhibit, for example, a dielectric constant up to approximately three to ensure adequate electrically insulative properties. It is noted that the soft-bake or B-stage curing of the die attach material 112 helps to prevent movement of the semiconductor dice 114 relative to the substrate 102 during subsequent baking or curing operations.

Figure 1C:
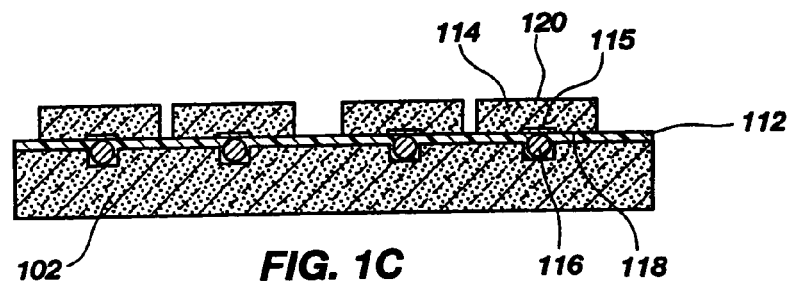

As shown in FIG. 1C, a plurality of discrete semiconductor dice 114 is provided, each having a plurality of signal connection devices, shown as conductive bumps 116, attached to bond pads 115. The semiconductor dice 114 are placed upside down with the conductive bumps 116 positioned in the cavities 105 and with the active surface 118 of the semiconductor dice 114 in contact with the die attach material 112. It is noted that the size of the cavities 105 may be etched slightly larger in breadth and/or depth than the size of the conductive bumps 116 in order to ensure proper fit of the conductive bumps 116 within the cavities 105. The conductive bumps 116 may be formed, for example, as gold stud bumps applied with a conventional wire bond process. Other signal connection devices, such as copper stud bumps or plated-type stud bumps, may also be used. Although drawing FIGS. 1C through 1F show the conductive bumps 116 as generally spherical balls, the conductive bumps 116 may actually be formed in other shapes, including pillars and columns.

In addition, for simplicity, drawing FIGS. 1A through 1F show a single row of conductive bumps 116 positioned extending down the longitudinal axis of each of the semiconductor dice 114, which longitudinal axis is oriented transverse to the plane of the page. However, other conductive bump 116 arrangements such as, for example, an arrangement around the periphery of a semiconductor die 114 or an array of conductive bumps 116 across the active surface 118 of a semiconductor die 114, are also within the scope of the present invention. Furthermore, the semiconductor dice 114 may be of more than one functional variety appropriately arranged so as to create what is referred to as a system on a chip, as will be described in further detail below.

Figure 1D:
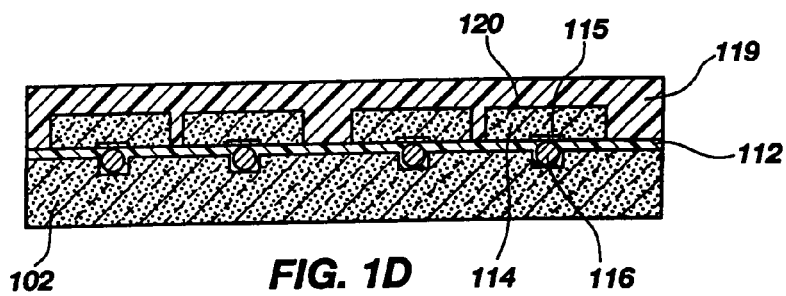

With the semiconductor dice 114 attached to the substrate 102, a molding or encapsulating layer 119 is formed over the top surface 104 of the substrate 102 and the back side 120 of the semiconductor dice 114 as shown in drawing FIG. 1D. The molding layer 119 may be any of a variety of compounds known in the art for the purpose of encapsulating the semiconductor dice 114 and substrate 102 to form a typical chip scale package. The molding layer 119 may include a filled polymer and may desirably comprise a material having properties sufficient to allow it to withstand temperatures of up to about 300° C. without substantial degradation thereof.

Figure 1E:
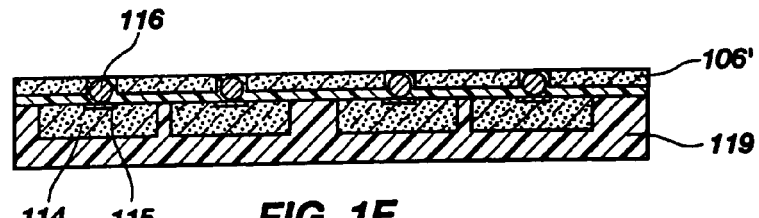

After the molding layer 119 is disposed on the top surface 104 of the substrate 102 and properly cured, a portion of the substrate 102 along its new bottom surface 106' is removed as is shown in drawing FIG. 1E. It is noted that, for purposes of clarity, the assembly, as shown in drawing FIG. 1E (as well as in subsequent drawing FIG. 1F), is flipped upside down relative to that which is shown in drawing FIGS. 1A through 1D. The portion of material may be removed from the bottom surface 106 of the substrate 102 by techniques, such as back-grinding; abrasive planarization techniques, such as chemical-mechanical planarization (CMP); etching or an atmospheric downstream plasma (ADP) process offered by Tru-Si Technologies of Sunnyvale, Calif., which is known by those of ordinary skill in the art. Material is removed from the bottom surface 106 of the substrate 102 until the conductive bumps 116 are exposed, creating a new bottom surface 106' (also referred to as an opposing surface) of the substrate 102, as shown in drawing FIG. 1B. With the conductive bumps 116 exposed, a system on a chip structure has been created with an array of exposed conductive bumps 116.

Figure 1F:
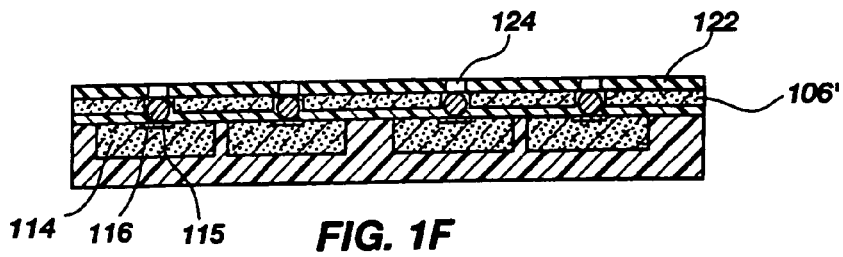

To prepare the wafer for a redistribution layer (RDL) process, a dielectric layer 122 is formed covering the new bottom surface 106' of the wafer and the conductive bumps 116, as shown in drawing FIG. 1F. Finally, a plurality of vias or openings 124 is formed in the dielectric layer 122 over the conductive bumps 116, such as with a conventional etching process. The assembly may then be subjected to an RDL process to redistribute or relocate the signals to an arrangement of signal device or input/output connections.

Before describing the redistribution layer process, another embodiment of the present invention is described as shown in drawing FIGS. 2A through 2D. The process begins, as in the previously described embodiment, with a substrate 202 such as a silicon wafer as shown in drawing FIG. 2A. Again, cavities 205 are formed in the substrate 202, each cavity being defined by a cavity base 208 and cavity walls 210. However, in the presently described embodiment, the cavities 205 are of a size sufficient to receive substantially the entirety of each individual semiconductor die 214. Additionally, the cavities 205 are formed to a depth short of back side 206 sufficient to allow the active surface 220 of the semiconductor dice 214 to be substantially flush with the top surface 204 of the substrate 202. It is noted that, since different types of semiconductor dice 214 may be used, the cavities 205 may accordingly differ in size and shape from one cavity to another.

Figure 2A:
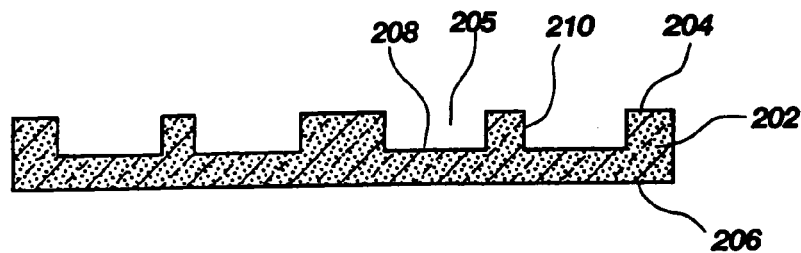
FIGS. 2A through 2D show cross-sectional views of a system package at various stages of fabrication according to another embodiment of the present invention.
Figure 2B:
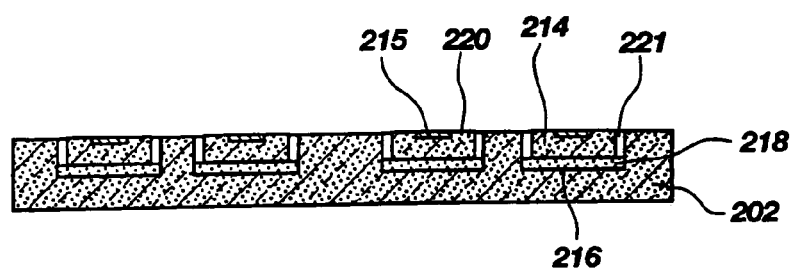
Figure 2C:
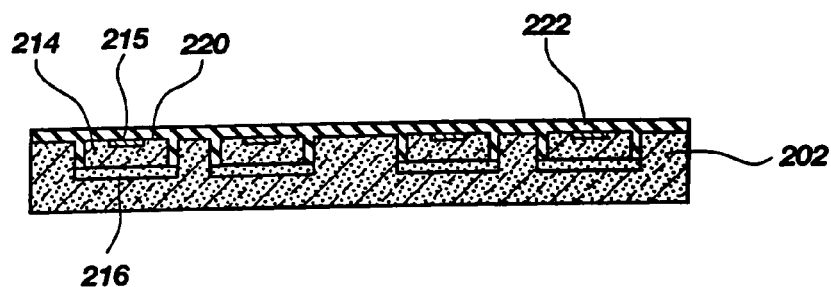
Figure 2D:
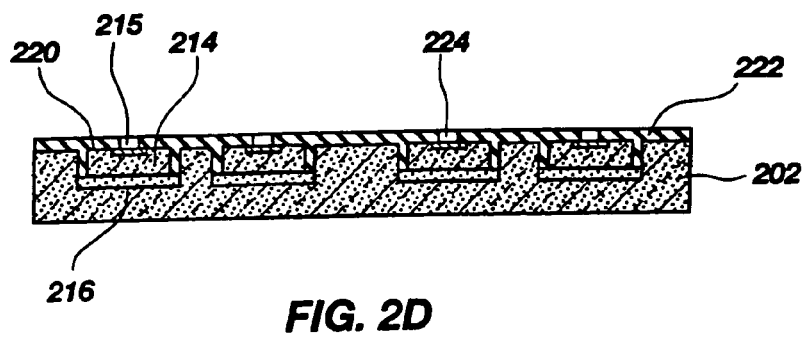

As shown in drawing FIG. 2B, a layer of die attach material 218 is applied in the cavities 205. Discrete semiconductor dice 214 are then placed in the cavities 205 with the active surface 220 of the semiconductor dice 214 facing upwards and the back surface 216 of the semiconductor dice 214 being attached to the cavity base 208 of its respective cavity 205 via the die attach material 218. As shown in drawing FIG. 2C, a first dielectric layer 222 is applied over the top surface 204 (also referred to as a first surface and not shown) of the substrate 202 and which may fill in any gaps 221 (FIG. 2B) between the sides of the semiconductor dice 214 and the cavity walls 210. The first dielectric layer 222 may be applied in a conventional process such as spin coating or spray coating. Finally, as shown in drawing FIG. 2D, a plurality of vias or openings 224 is formed in the first dielectric layer 222, such as by an etching process, thereby exposing the plurality of underlying signal connection devices shown as bond pads 215.

Figure 3A:
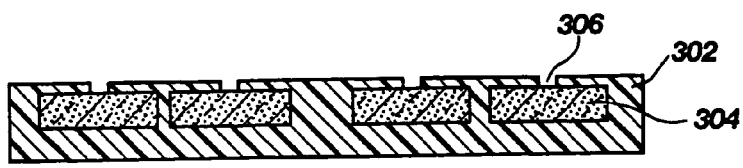
FIGS. 3A through 3F show cross-sectional views of a system package including a redistribution layer according to another embodiment of the present invention.
Figure 3B:
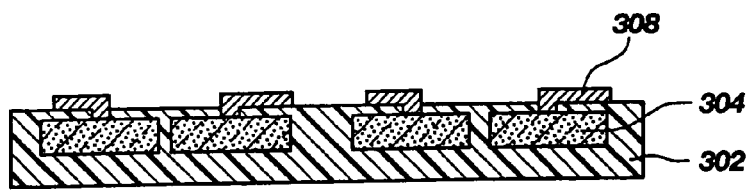

The RDL process, which is applicable to both of the exemplary embodiments discussed above, is shown and described with respect to drawing FIGS. 3A through 3F. Illustrated in drawing FIG. 3A is a general substrate 302 with embedded semiconductor dice 304 and signal connection openings 306 representing any embodiment within the scope of the invention. The process begins, as shown in drawing FIG. 3B, by a metallization layer and patterning process to create a first circuit connection layer 308 of metal covering the plurality of signal connection openings 306. In the exemplary embodiments, the signal connection openings 306 expose either the conductive bumps 116 in the embodiment shown and described with respect to drawing FIGS. 1A through 1F or the bond pads 215 in the embodiment shown and described with respect to drawing FIGS. 2A through 2D. This results in an electrical connection to the underlying semiconductor dice 304 and creates first circuit connection layer 308, shown as circuit lines, to redistribute and possibly connect the signals to other metallization layers.

The RDL process may incorporate metallization layer deposition and etching processes well known in the art to form the pattern of openings and first circuit connection layers 308. Further, the metal layer may be formed of a material including, for example, aluminum, copper, or other alloys known and utilized in the art. It is also noted that signal connection devices (e.g., the conductive bumps 116 of drawing FIG. 1C or the bond pads 215 of drawing FIG. 2C) may be treated or have an under-bump metallization-type material placed thereon prior to connection with the first circuit connection layer 308 to enhance metallic adhesion therebetween.

Figure 3C:
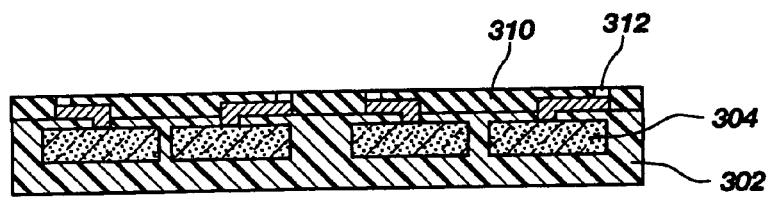
Figure 3D:
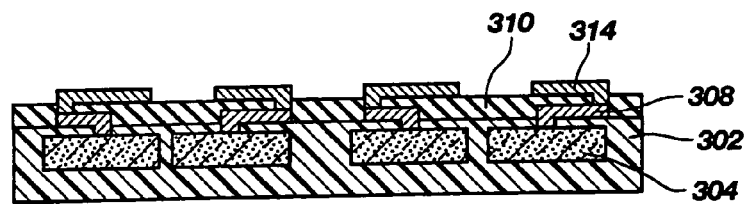

A predetermined number of additional metal layers may be added in a basic three-step signal connection layering process as shown in drawing FIGS. 3C and 3D. For example, a new additional dielectric layer 310 is formed over the previous metal and dielectric layers, coating the entire wafer. Next, a plurality of vias or openings 312 is created in the dielectric layer 310, such as by etching, exposing the underlying first circuit connection layer 308 at a desired plurality of circuit connection areas. Finally, a new metallization and patterning process creates a new circuit connection layer 314, shown in drawing FIG. 3D, making desired electrical connections to the underlying first circuit connection layer 308 and redistributing signals to new locations, possibly for connection to higher metal layers. For simplicity, the drawing FIGS. 3A–3D show the formation of only one additional metal layer. However, this process may be repeated a predetermined number of times (for example, three times to create three intermediate signal routing layers), thereby forming a laminate-type structure. Multiple layers may be desired to create power planes, ground planes, and difficult signal interconnections not easily accomplished on two signal layers.

Figure 3E:
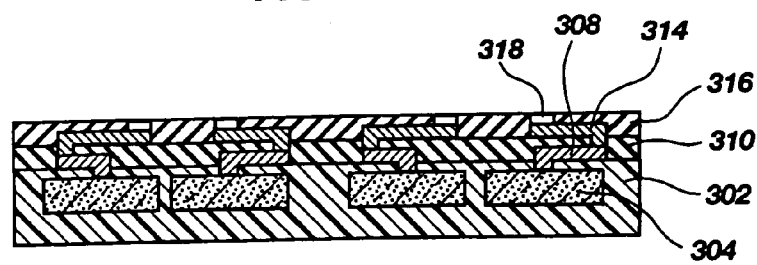
Figure 3F:
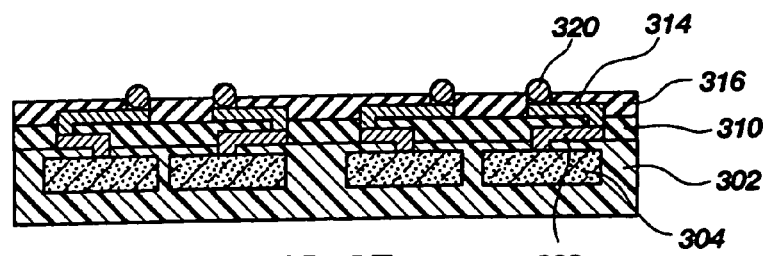

As shown in drawing FIGS. 3E and 3F, a final dielectric layer 316 is applied over the previous dielectric layer 310 and new circuit connection layer 314. Again, a conventional etching process is used to create a plurality of vias or openings 318 in the final dielectric layer 316 exposing the underlying new circuit connection layer 314. Finally, new signal device connections 320, such as solder balls or other conductive bumps, are formed in the plurality of openings 318 contacting the underlying new circuit connection layer 314.

With the new signal device connections 320 formed, if desired, testing could be accomplished through connection with the new signal device connections 320 of each of the individual multichip packages.

Figure 4:
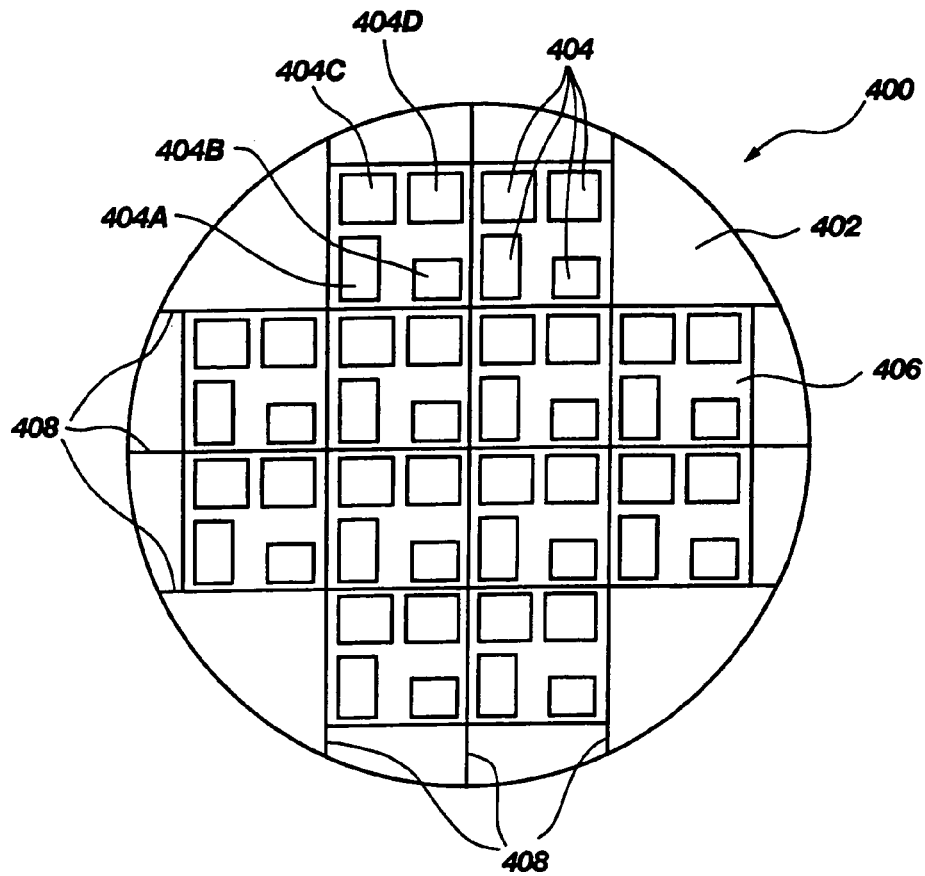
FIG. 4 is a plan view showing a wafer including a plurality of sections, each containing a plurality of semiconductor dice, according to the present invention.

Referring now to drawing FIG. 4, an assembly 400 containing a plurality of semiconductor dice 404A–404D (collectively referred to as semiconductor dice 404) is shown according to an embodiment of the present invention. The substrate 402 is sawed into individual segments 406 along sawing lines 408 to form individual systems on chip modules with each segment 406 containing a plurality of semiconductor dice 404A–404D possibly of multiple functional varieties. For example, semiconductor die 404A might be a processor, semiconductor die 404B might be a memory controller and semiconductor dice 404C and 404D might be memory chips. Although drawing FIG. 4 shows a segment 406 containing four semiconductor dice 404A–404D, it should be understood that the number of semiconductor dice within a segment 406 may be some other number depending on the design and intended use of the resulting semiconductor package.

Figure 5:
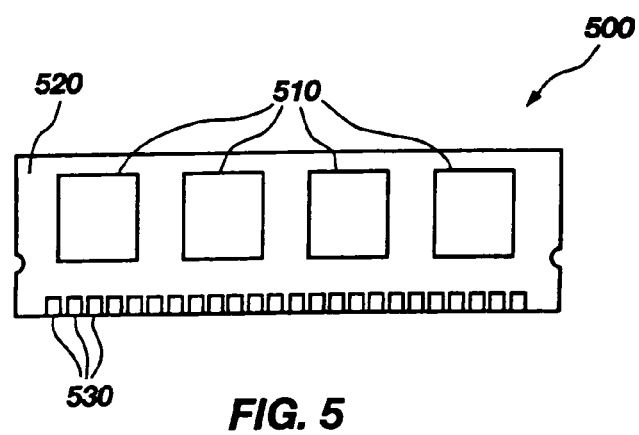
FIG. 5 is a plan view showing a plurality of multichip modules according to the present invention on a memory device.

Referring now to drawing FIG. 5, a memory device 500, also referred to as a memory module, is shown which incorporates at least one packaged multichip semiconductor device 510 according to the present invention. The memory device 500 includes a carrier substrate 520, such as a printed circuit board, to which one or more packaged multichip semiconductor devices 510 may be electrically and operably coupled therewith. A plurality of electrical connectors 530 is formed on the carrier substrate 520 to provide input and output connections with an external device, such as, for example, the motherboard of a computer, to the one or more packaged multichip semiconductor devices 510.

Figure 6:
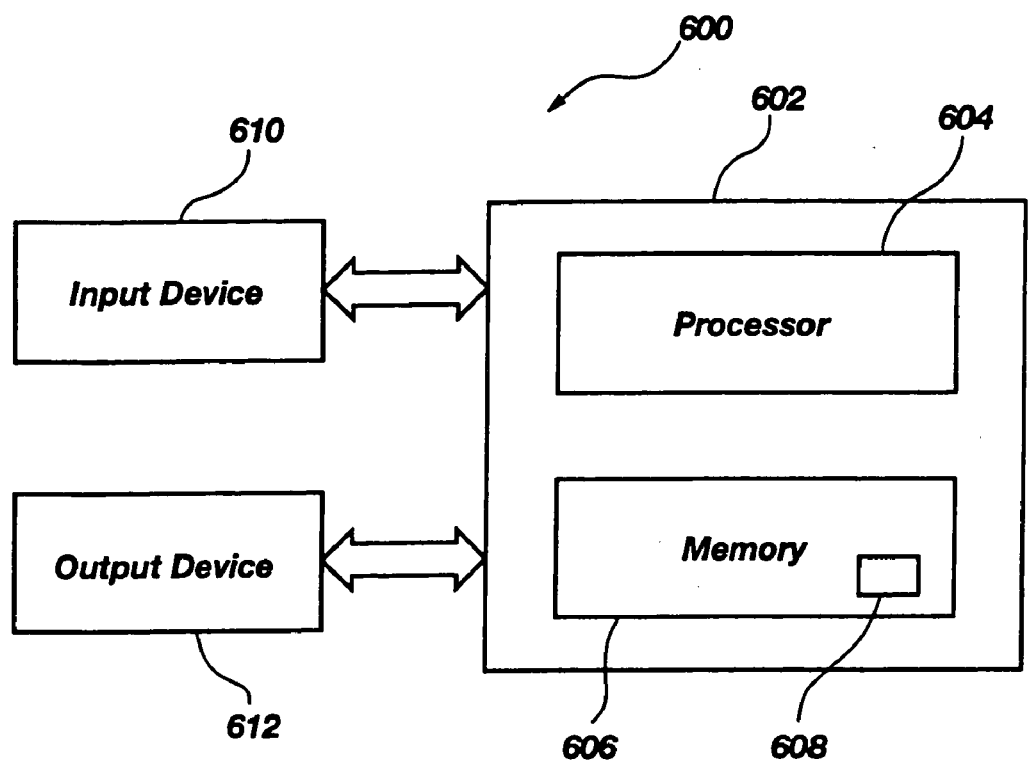
FIG. 6 is a block diagram showing a memory device including at least one of the multichip modules according to the present invention incorporated in a computing system.

Referring now to drawing FIG. 6, a computing system 600 is shown which includes a carrier substrate 602 such as, for example, a motherboard. The carrier substrate 602 may be operably coupled to at least one processor 604, such as, for example, a central processing unit (CPU), and at least one memory device 606. The memory device 606 may include one or more packaged multichip semiconductor devices 608 such as described above. The carrier substrate 602 is operably coupled with at least one input device 610 such as, for example, a keyboard, a mouse, a sensor or another computing device. The carrier substrate 602 is also operably coupled with at least one output device 612 such as, for example, a printer, a monitor, an actuator or another computing device. Alternatively, the packaged multichip semiconductor device 608 may be coupled directly with the carrier substrate 602.

Specific embodiments have been shown by way of example in the drawings and have been described in detail herein; however, the invention may be susceptible to various modifications and alternative forms. It should be understood that the invention is not intended to be limited to the particular forms disclosed. Rather, the invention includes all modifications, equivalents, and alternatives falling within the spirit and scope of the invention as defined by the following appended claims.

What is claimed is:

1. A semiconductor device package, comprising:
    a plurality of semiconductor dice, each semiconductor die of the plurality having a back surface, an active surface and a plurality of signal connection devices on the active surface; and
    a substrate having an attachment surface, an opposing surface and a plurality of substrate openings formed therethrough, wherein each of the plurality of signal connection devices is positioned in one of the plurality of substrate openings and the active surfaces of the plurality of semiconductor dice are adhered to the attachment surface of the substrate permitting exposure of the plurality of signal connection devices through the plurality of substrate openings.

2. The semiconductor device package of claim 1, further comprising a molding layer disposed over the attachment surface of the substrate and the back surfaces of the plurality of semiconductor dice.

3. The semiconductor device package of claim 2, wherein the molding layer comprises a material which is capable of withstanding a temperature of up to about 300° C. without substantial degradation thereof.

4. The semiconductor device package of claim 1, further comprising:
    a first dielectric layer disposed on the opposing surface of the substrate; and
    a plurality of first dielectric openings in the first dielectric layer exposing the plurality of signal connection devices therethrough.

5. The semiconductor device package of claim 4, further comprising:
    a first circuit layer disposed over the first dielectric layer electrically connected to the plurality of signal connection devices;
    an outermost dielectric layer having a plurality of holes formed therethrough, the outermost dielectric layer being disposed over the first circuit layer; and
    a plurality of conductive bumps disposed in the plurality of holes of the outermost dielectric layer and electrically coupled with the first circuit layer.

6. The semiconductor device package of claim 4, further comprising:
    a first circuit layer disposed over the first dielectric layer electrically connected to the plurality of signal connection devices;
    at least one additional dielectric layer, having at least one additional plurality of openings formed therethrough;
    at least one additional circuit layer disposed over the at least one additional dielectric layer electrically coupled with the first circuit layer;
    an outermost dielectric layer having a plurality of holes formed therethrough, the outermost dielectric layer being disposed over the at least one additional circuit layer; and
    a plurality of conductive bumps disposed in the plurality of holes of the outermost dielectric layer and electrically coupled with the at least one additional circuit layer.

7. The semiconductor device package of claim 1, wherein the substrate comprises a silicon wafer.

8. The semiconductor device package of claim 1, wherein the plurality of signal connection devices is selected from the group consisting of gold stud bumps, copper stud bumps, and plated stud bumps.

9. The semiconductor device package of claim 1, wherein each of the plurality of substrate openings exhibits a depth which is at least as great as or greater than a height of each of the plurality of signal connection devices.

10. The semiconductor device package of claim 1, further comprising a layer of die attach material disposed between and adhering the active surface of each of the plurality of semiconductor dice and the attachment surface of the substrate.

11. The semiconductor device package of claim 10, wherein the layer of die attach material comprises a material selected from the group consisting of an epoxy material, a polyimide material, and benzocyclobutene.

12. The semiconductor device package of claim 10, wherein the layer of die attach material exhibits a dielectric constant of up to about three.

13. A memory device, comprising:
    a carrier substrate;
    a plurality of electrical contacts coupled with electrical circuitry formed in the carrier substrate; and
    at least one semiconductor device package coupled with the electrical circuitry in the carrier substrate, the at least one semiconductor device package comprising:
        a plurality of semiconductor dice, each semiconductor die of the plurality having a back surface, an active surface and a plurality of signal connection devices on the active surface; and a substrate having an attachment surface, an opposing surface and a plurality of substrate openings formed therethrough, wherein each of the plurality of signal connection devices is positioned in one of the plurality of substrate openings and the active surfaces of the plurality of semiconductor dice are adhered to the attachment surface of the substrate permitting exposure of the plurality of signal connection devices through the plurality of substrate openings.

14. A computing system, comprising:

a processor;

at least one input device operably coupled with the processor;

at least one output device operably coupled with the processor; and a memory device operably coupled with the processor, the memory device comprising;

a plurality of semiconductor dice, each semiconductor die of the plurality having a back surface, an active surface and a plurality of signal connection devices on the active surface; and a substrate having an attachment surface, an opposing surface and a plurality of substrate openings formed therethrough, wherein each of the plurality of signal connection devices is positioned in one of the plurality of substrate openings and the active surfaces of the plurality of semiconductor dice are adhered to the attachment surface of the substrate permitting exposure of the plurality of signal connection devices through the plurality of substrate openings.

15. A semiconductor device package, comprising:

a plurality of semiconductor dice, each semiconductor die of the plurality having a back surface, an active surface and a plurality of signal connection devices on the active surface;

a substrate having a plurality of cavities formed in a first surface of the substrate, wherein each semiconductor die of the plurality is disposed in one of the plurality of cavities with the back surface of each semiconductor die facing a base of its respective one of the plurality of cavities;

a first dielectric layer disposed on the first surface of the substrate and upon the active surface of each of the plurality of semiconductor dice; and a plurality of first dielectric openings in the first dielectric layer exposing the plurality of signal connection devices therethrough.

16. The semiconductor device package of claim 15, further comprising:

a first circuit layer disposed over the first dielectric layer electrically connected to the plurality of signal connection devices;

an outermost dielectric layer having a plurality of holes formed therethrough, the outermost dielectric layer being disposed over the first circuit layer; and a plurality of conductive bumps disposed in the plurality of holes of the outermost dielectric layer and electrically coupled with the first circuit layer.

17. The semiconductor device package of claim 15, further comprising:

a first circuit layer disposed over the first dielectric layer electrically connected to the plurality of signal connection devices;

at least one additional dielectric layer, having at least one additional plurality of openings formed therethrough;

at least one additional circuit layer disposed over the at least one additional dielectric layer electrically coupled with the first circuit layer;

an outermost dielectric layer having a plurality of holes formed therethrough, the outermost dielectric layer being disposed over the at least one additional circuit layer; and a plurality of conductive bumps disposed in the plurality of holes of the outermost dielectric layer and electrically coupled with the at least one additional circuit layer.

18. A semiconductor device package, comprising:

a plurality of semiconductor dice, each semiconductor die of the plurality having a back surface, an active surface and a plurality of signal connection devices on the active surface; and a substrate having a plurality of cavities formed in a first surface of the substrate, wherein each semiconductor die of the plurality is disposed in one of the plurality of cavities with the back surface of each semiconductor die facing a base of its respective one of the plurality of cavities;

wherein the substrate comprises a silicon wafer.

19. The semiconductor device package of claim 18, wherein the plurality of signal connection devices comprises bond pads.

20. The semiconductor device package of claim 18, wherein each of the plurality of cavities exhibits a same depth which is at least equal to or greater than a height of each the plurality of semiconductor dice.

21. The semiconductor device package of claim 18, further comprising a layer of die attach material disposed in the plurality of cavities and adhering the back surface of each of the plurality of semiconductor dice to the base of its respective one of the plurality of cavities.

22. The semiconductor device package of claim 21, wherein the layer of die attach material comprises a material selected from the group consisting of an epoxy material, a polyimide material, and benzocyclobutene.

23. The semiconductor device package of claim 21, wherein the layer of die attach material exhibits a dielectric constant of up to about three.

24. A memory device, comprising:

a carrier substrate;

a plurality of electrical contacts coupled with electrical circuitry formed in the carrier substrate; and at least one semiconductor device package coupled with the electrical circuitry in the carrier substrate, the at least one semiconductor device package comprising:

a plurality of semiconductor dice, each semiconductor die of the plurality having a back surface, an active surface and a plurality of signal connection devices on the active surface; and a substrate having a plurality of cavities formed in a first surface of the substrate, wherein each semiconductor die of the plurality is disposed in one of the plurality of cavities with the back surface of each semiconductor die facing a base of its respective one of the plurality of cavities.

25. A computing system, comprising:

a processor;

at least one input device operably coupled with the processor;

at least one output device operably coupled with the processor; and a memory device operably coupled with the processor, the memory device comprising;

a plurality of semiconductor dice, each semiconductor die of the plurality having a back surface, an active surface and a plurality of signal connection devices on the active surface; and a substrate having a plurality of cavities formed in a first surface of the substrate, wherein each semiconductor die of the plurality is disposed in one of the plurality of cavities with the back surface of each semiconductor die facing a base of its respective one of the plurality of cavities.

* * * * *

UNITED STATES PATENT AND TRADEMARK OFFICE
CERTIFICATE OF CORRECTION

PATENT NO. : 7,087,992 B2  Page 1 of 1
APPLICATION NO. : 10/999435
DATED : August 8, 2006
INVENTOR(S) : Swee Kwang Chua et al.

It is certified that error appears in the above-identified patent and that said Letters Patent is hereby corrected as shown below:

On the title page:
In ITEM (75) "Inventors," 6th line    change "Suangwu" to --Shuangwu--

In the specification:

COLUMN 7,  LINE 2,    change "back-grinding;" to --back-grinding,--
COLUMN 7,  LINE 10,   change "FIG. 1B." to --FIG. 1E.--

Signed and Sealed this

Thirteenth Day of November, 2007

JON W. DUDAS
*Director of the United States Patent and Trademark Office*